United States Patent [19]

Catlin

[11] Patent Number: 5,161,218
[45] Date of Patent: * Nov. 3, 1992

[54] MEMORY CONTROLLER FOR USING RESERVED DRAM ADDRESSES FOR EMS

[75] Inventor: Robert W. Catlin, Santa Clara, Calif.

[73] Assignee: Chips and Technologies, Inc., San Jose, Calif.

[*] Notice: The portion of the term of this patent subsequent to Aug. 18, 2009 has been disclaimed.

[21] Appl. No.: 614,183

[22] Filed: Nov. 13, 1990

Related U.S. Application Data

[63] Continuation of Ser. No. 435,323, Nov. 13, 1987, Pat. No. 4,985,871.

[51] Int. Cl.[5] .............. G06F 12/00; G06F 12/10; G11C 8/00
[52] U.S. Cl. .............. 395/425; 364/DIG. 1; 364/245.31; 365/230.01; 365/230.02; 365/230.06
[58] Field of Search ........... 364/DIG. 1; 365/230.01, 365/230.03, 230.06, 230.02; 395/425

[56] References Cited

U.S. PATENT DOCUMENTS

| | | | |
|---|---|---|---|
| 3,970,999 | 7/1976 | Elward | 364/200 |
| 4,403,283 | 9/1983 | Myntti et al. | 364/200 |
| 4,545,010 | 10/1985 | Salas et al. | 364/200 |
| 4,761,736 | 8/1988 | Di Orio | 364/200 |
| 4,849,875 | 7/1989 | Fairman et al. | 364/200 |
| 4,891,752 | 1/1990 | Fairman et al. | 364/200 |
| 4,926,322 | 5/1990 | Stimac et al. | 364/200 |
| 4,984,213 | 1/1991 | Abdoo et al. | 365/230.06 X |
| 4,985,871 | 1/1991 | Catlin | 365/230.06 |
| 5,005,157 | 4/1991 | Catlin | 365/230.06 X |

*Primary Examiner*—Alyssa H. Bowler
*Attorney, Agent, or Firm*—Townsend and Townsend

[57] ABSTRACT

A memory controller which can map EMS addresses into the DRAM behind video RAM addresses or other reserved areas of memory. A single chip has both a DRAM decoder and an EMS decoder operating in parallel. A DRAM decoder examines received addresses and provides an enable signal to a DRAM timing circuit if the address is within the DRAM range and not for a reserved group of addresses. A separate EMS decoder provides a translated address when a received address is within an EMS window. The EMS decoder also provides an EMS timing signal to the DRAM timing circuit.

9 Claims, 2 Drawing Sheets

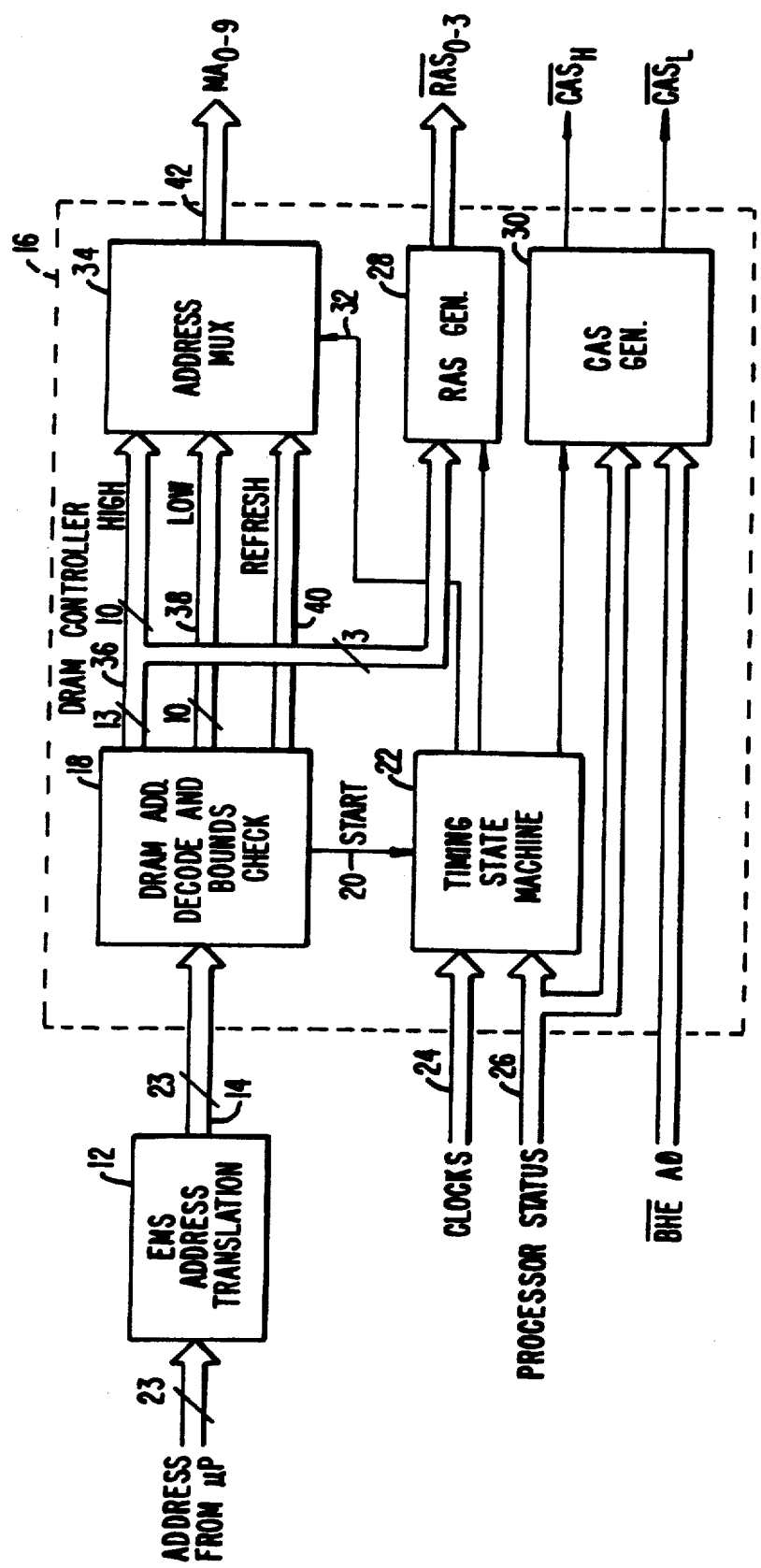
FIG._1. PRIOR ART

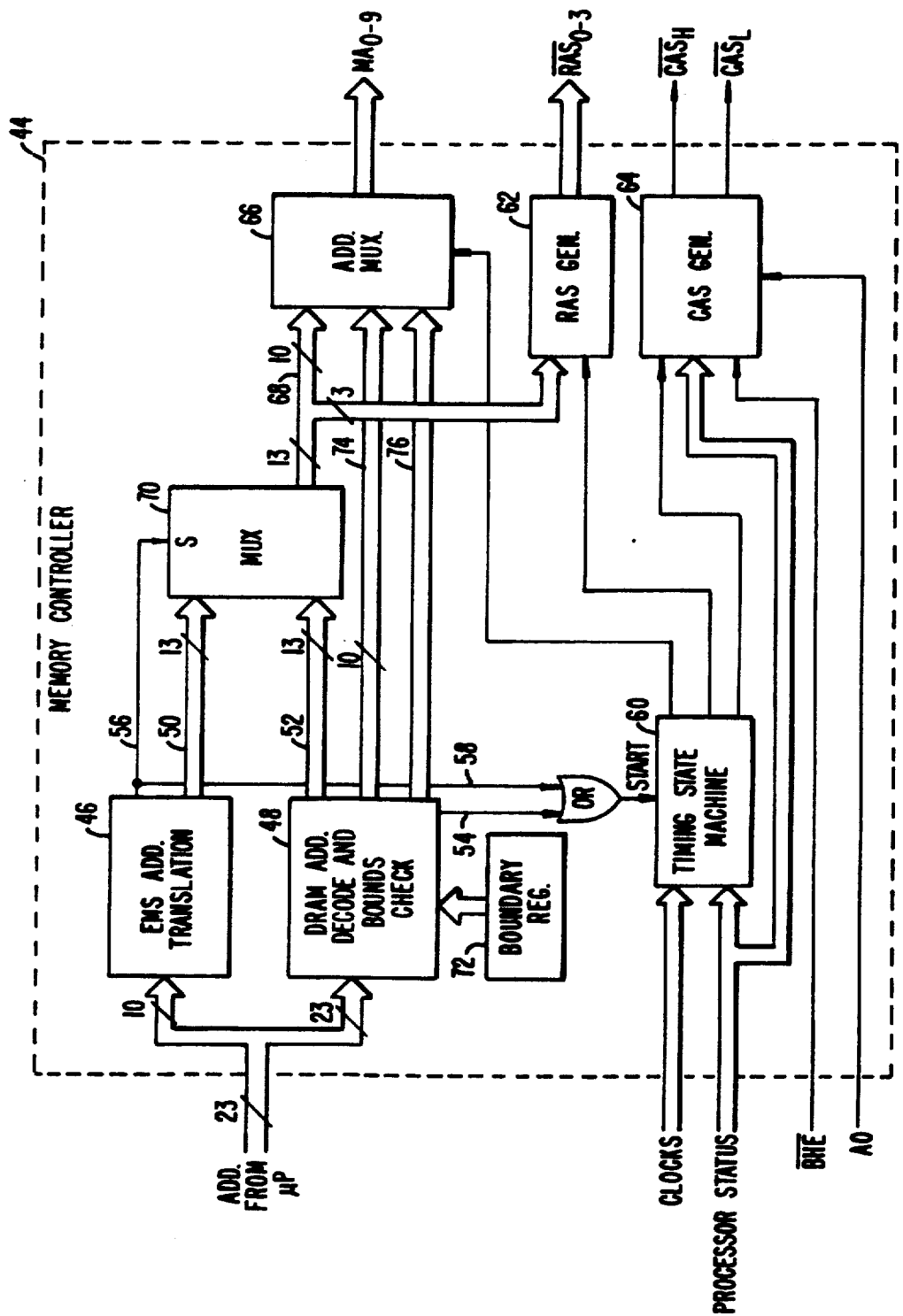
FIG._2.

MEMORY CONTROLLER FOR USING RESERVED DRAM ADDRESSES FOR EMS

This is a continuation of application Ser. No. 435,323, filed Nov. 13, 1989, and U.S. Pat No. 4,985,871.

BACKGROUND OF THE INVENTION

The present invention relates to memory controllers using expanded memory space (EMS) to map an address from one location to another.

The EMS translation function is typically done in a support chip for use with a microprocessor in a personal computer. One such semiconductor chip is Part No. 82C631 from Chips and Technologies. In an EMS system, the microprocessor will provide addresses only within a certain range, for instance, 1 megabyte. Within that 1 megabyte range, certain designated address "windows" are provided. When the EMS circuitry sees an address within that window, it provides a translated address from a register in substitution for the window address. Thus, an address window in the 1 megabyte range can point to an EMS address location in, for instance, anywhere from 2 to 16 megabytes.

Another type of support chip used with a microprocessor is a dynamic random access memory (DRAM) controller chip, such as Part No. 82C212 from Chips and Technologies. The DRAM controller receives the addresses from the microprocessor and generates the necessary timing and select signals depending upon how memory is organized. (A memory may be organized into four banks of chips, and the DRAM controller will produce one of four select signals to choose one of the four banks of chips.) The DRAM controller will also have decode circuitry to determine if the address is intended for DRAM. Certain addresses are not intended for DRAM, such as BIOS (basic input/output system) ROM (read-only memory) addresses and video RAM addresses. A separate, video RAM is often used which is dual-ported so it can be accessed directly by the microprocessor or a video controller. Thus, where addresses are intended for these ROM devices or dual-ported RAM areas, the DRAM controller will not act on the addresses. Because the memory space used for BIOS ROM and video RAM is unavailable for DRAM, some systems will physically remove DRAM chips from those areas. Other systems will physically place DRAM chips in those areas, but provide rerouting circuitry so that a different logical address activates those chips. For the BIOS ROM, "shadow" RAM is often used to provide a duplicate copy of the contents of the BIOS ROM. This is done when a system is powered up to put the BIOS ROM contents in the more quickly accessible DRAM. Since the DRAM requires constant refresh, it cannot be used to permanently store the BIOS ROM contents. This is an expensive duplication of memory which makes sense for the small, often-used BIOS ROM. There has been no practical alternate use of DRAM "behind" the video RAM.

When EMS translation is used in combination with a DRAM controller, the DRAM controller waits to see if there is an EMS translation before examining the addresses. Otherwise, the DRAM would try to access the window address directly. By waiting and looking at the translated address out of the translator, the DRAM controller avoids getting a window address which is not for it. When an address is for a reserved section of memory, the DRAM controller will ignore it. The EMS circuit cannot target reserved sections with translated addresses because the DRAM controller will ignore them since it cannot tell the difference between such a translated address and an address intended for BIOS ROM or video RAM.

SUMMARY OF THE INVENTION

The present invention provides a memory controller which can map EMS addresses into the DRAM behind video ROM addresses or other reserved areas of memory. A single chip has both a DRAM decoder and an EMS decoder operating in parallel. A DRAM decoder examines received addresses and provides an enable signal to a DRAM timing circuit if the address is within the DRAM range and not for a reserved group of addresses. A separate EMS decoder provides a translated address when a received address is within an EMS window. The EMS decoder also provides an EMS timing signal to the DRAM timing circuit.

This invention allows reserved areas of memory to be filled with DRAM and used as EMS target areas by proper programming of the EMS translation registers. Since the EMS decoder can directly activate the DRAM timing circuit, there is no need to wait for the EMS translated addresses by the DRAM decoder. The DRAM decoder is thus placed in parallel with the EMS decoder, thereby shortening the processing time. If the DRAM decoder determines that an address is for a reserved section, it will not produce a timing enable signal, but will be overruled by the EMS timing enable signal if there is an EMS translation.

In one embodiment, a multiplexer selects either the EMS translated address or the untranslated address. The output of this multiplexer is provided both as a DRAM output of the chip and as an input to the RAS (row address strobe) generation logic to select an appropriate bank of memory.

For a fuller understanding of the nature and advantages of the invention, reference should be made to the ensuing detailed description taken in conjunction with the accompanying drawings.

BRIEF DESCRIPTION OF THE DRAWINGS

FIG. 1 is a block diagram of a prior art EMS and DRAM controller arranged in series; and FIG. 2 is a block diagram of the combined memory controller of the present invention.

DETAILED DESCRIPTION OF THE PRESENT INVENTION

FIG. 1 shows a conventional EMS system according to the prior art. An address bus 10 from the microprocessor with 23 address bits is provided to an EMS translation chip 12, such as Chips and Technologies Part No. 82C631. EMS chip 12 will use the high end portion of the address to select an EMS window register. If it is enabled, the corresponding translation register will be substituted for the high end portion of the address. An output bus 14 provides either translated addresses or unaltered addresses to a DRAM controller chip 16. DRAM controller 16 includes DRAM address decode and bounds check logic 18. This logic will consult DRAM configuration registers to determine if the address is within the range of the installed DRAM and whether the address is directed to a reserved section of DRAM. Typical uses of such reserved sections of DRAM are for video RAM or for BIOS ROM.

If the address on bus 14 is within the DRAM range, and not for a reserved section, a start cycle signal on a line 20 will be provided to a timing circuit 22. Timing circuit 22 also receives clock signals on lines 24 and processor status signals on lines 26. Timing logic 22 provides control signals to an RAS generation circuit 28 and a CAS (column address strobe) generation circuit 30. In the embodiment shown, the RAS signals choose one of four banks of memory, while the CAS signals choose the high or low portion of each bank of memory. The RAS generator 28 also receives the high-order address bits on lines 36 which are used to select the appropriate row.

Timing generator 22 also provides select signals on lines 32 to an address multiplexer 34. Address multiplexer 34 receives the high address bits on lines 36, the low address bits on lines 38 and refresh address bits on lines 40. The refresh address bits are provided by DRAM decoder 18 to select the appropriate addresses for refreshing. The output of address multiplexer 34 is provided onto 10 output lines 42.

CAS generator 30 also receives the BHE and A0 signals for the purpose of selecting the high byte, low byte or both.

FIG. 2 is a block diagram of a preferred embodiment of the present invention. A 23-bit address bus 10 from the microprocessor is provided as an input to a memory controller chip 44. Once on the chip, these address bits are provided to both an EMS address translation logic circuit 46 and a DRAM address decode and boundary checking circuit 48. EMS circuit 46 looks at the 10 most significant bits of the address and does an address translation which is provided on output lines 50 if the address is within an EMS window. The decoding is done by comparison to EMS window registers, and providing a translated address from EMS translation registers in a similar manner to that of circuit 12 of FIG. 1.

As can be seen, lines 50 output from EMS translation circuit 46 are not provided as an address to the DRAM decoder as in the prior art. Instead, DRAM decoder 48 directly receives the addresses on lines 10 and processes them in parallel, passing on the high-order bits on lines 52 unaltered. If the DRAM decode circuit 48 detects an address within its range which is not for a reserved section, a timing enable signal will be generated on a line 54. A separate timing enable signal on a line 56 is generated from a page enable bit in an EMS translation register when an EMS translation is done. This page enable bit indicates that the EMS translation is valid. The two timing enable signals 54 and 56 are provided to an OR gate 58, the output of which is provided as an enable input to a timing circuit 60.

Timing circuit 60 provides control inputs to RAS generator circuit 62 and CAS generator circuit 64. In addition, it provides a select input to an address multiplexer 66. The high-order address inputs of address multiplexer 66 are provided on lines 68 from the output of a multiplexer 70. Multiplexer 70 selects either the EMS address on lines 50 or the untranslated address on lines 52. The selection by multiplexer 70 is determined by the same page enable bit on line 56.

Multiplexer 66 also receives the low order address bits on lines 74 and refresh address bits on lines 76.

The output lines 68 of multiplexer 70 are also provided as an input to RAS generator 62. Depending upon which input is selected, this input to RAS generator 62 will be either the EMS translated address or the unaltered address. In either case, this address will be used by RAS generator 62 to select one of four RAS signals.

The present invention also preferably includes a DRAM boundary register 72. This is a boundary in addition to the normal DRAM bounds register which sets forth the amount of installed DRAM. Instead, the boundary register is an arbitrary value less than the maximum amount of installed DRAM. This register is used to set an artificial boundary of memory space addressable directly by the microprocessor. The effect of this is to reserve the rest of the DRAM for EMS translation addresses.

With such a boundary register, in the extended memory mode, or protected mode (as distinguished from the expanded, or EMS operation in real mode), the DRAM controller will not respond if the address is above the boundary register value. This allows operation in both the protected mode and the real mode using EMS, without conflict in the memory allocation. The installed DRAM bounds register is not used, and we rely on the EMS programming not to provide an address beyond the installed DRAM.

As will be understood by those familiar with the art, the present invention may be embodied in other specific forms without departing from the spirit or essential characteristics thereof. For example, the EMS addresses can be translated into a region other than that behind the video RAM. Accordingly, the disclosure of the preferred embodiment of the invention is intended to be illustrative, but not limiting, of the scope of the invention which is set forth in the following claims.

What is claimed is:

1. A memory control circuit for controlling access to a memory, comprising:
   first memory decodes means, coupled to an address bus, for providing a first memory timing enable signal when an address on said address bus is within a first predetermined range of addresses and is not within a reserved group of addresses within said first range of addresses;
   second expanded memory space (EMS) decode means, coupled to said address bus, for providing a translated address which is within said reserved group of addresses and a second EMS timing enable signal when an address on said address bus is within a predetermined window of addresses; and
   memory control signal generation means, responsive to either said first memory timing enable signal or said second EMS timing enable signal, for providing memory control signals to access said memory.

2. The memory control circuit of claim 1 wherein said memory is DRAM memory and said memory control signal generation means is a DRAM timing circuit which provides row address strobe (RAS) and column address strobe (CAS) signals to said DRAM.

3. The memory control circuit of claim 2 wherein said reserved group of addresses includes addresses used for video RAM and BIOS ROM.

4. The memory control circuit of claim 2 further comprising at least one configuration register for storing a first address to determine said first predetermined range of addresses and a second address which is less than the amount of installed DRAM for restricting direct processing access to said first predetermined range.

5. A memory control circuit for controlling access to a memory, comprising:

DRAM decode means, coupled to an address bus, for providing a DRAM enable a signal when an address on said address bus is within a first predetermined range of addresses and is not within a reserved group of addresses within said first range of addresses;

expanded memory spaced (EMS) decode means, coupled to said address bus, for providing a translated address which is within said reserved group of addresses and an EMS enable signal when said address on said address bus is within a predetermined window of addresses; and means for providing said translated address to said memory when said EMS enable signal is active and providing said address to said memory when said EMS enable signal is not active and said DRAM enable signal is active.

6. The circuit of claim 5 wherein said means for providing includes a first multiplexer for selecting between high order bits of said address and high order bits of said translated address responsive to said EMS enable signal.

7. The circuit of claim 6 further comprising a RAS generator coupled to at least a portion of an output of said first multiplexer.

8. The circuit of claim 6 further comprising a second multiplexer having a first input coupled to an output of said first multiplexer and a second input coupled to an output of said DRAM decode means.

9. A memory control circuit for controlling access to a memory, comprising:

DRAM decode means, coupled to an address bus, for providing a DRAM enable signal when an address on said address bus is within a first predetermined range of addresses and is not within a reserved group of addresses within said first range of addresses;

expanded memory space (EMS) decode means, coupled to said address bus, for providing a translated address within said reserved group of addresses and an EMS enable signal when said address on said address bus is within a predetermined window of addresses;

means for providing said translated address to said memory when said EMS enable signal is active and providing said address to said memory when said EMS enable signal is not active and said DRAM enable signal is active, said means for providing including a first multiplexer for selecting between high order bits of said address and high order bits of said translated address responsive to said EMS enable signal; and a RAS generator coupled to at least a portion of an output of said first multiplexer.

* * * * *